United States Patent [19]

Vongfuangfoo et al.

[11] Patent Number: 5,695,593
[45] Date of Patent: Dec. 9, 1997

[54] METHOD OF CENTERING A HIGH PRESSURE LID SEAL

[75] Inventors: Sutee Vongfuangfoo, Sunnyvale; Mirek Boruta, Castro Valley; Galen Kirkpatrick, Fremont, all of Calif.

[73] Assignee: LSI Logic Corporation, Milpitas, Calif.

[21] Appl. No.: 538,629

[22] Filed: Oct. 4, 1995

[51] Int. Cl.$^6$ ............................................. B25B 27/02
[52] U.S. Cl. ..................... 156/300; 156/579; 156/580; 269/238; 269/903
[58] Field of Search ........................... 156/299, 300, 156/579, 580, 581, 583.1; 269/47, 52, 238, 254 R, 254 CS, 903

[56] References Cited

U.S. PATENT DOCUMENTS

| | | | |
|---|---|---|---|
| 3,775,644 | 11/1973 | Cotner et al. | 269/903 X |
| 4,669,416 | 6/1987 | Delgado et al. | 118/503 |
| 4,875,966 | 10/1989 | Perko et al. | 156/580 |
| 5,106,451 | 4/1992 | Kan et al. | 156/583.3 |
| 5,154,339 | 10/1992 | Takeuchi et al. | 269/903 X |
| 5,465,470 | 11/1995 | Vongfuangfoo et al. | 29/559 |
| 5,501,436 | 3/1996 | Miller | 269/47 |

*Primary Examiner*—James Sells
*Attorney, Agent, or Firm*—Luedeka Neely & Graham PC

[57] ABSTRACT

A lid is sealed to an integrated circuit package by a method that uses a spring biased pressure foot that is structurally carried by a secondary loading jig to impose sealant curing load on the lid. The pressure foot is retracted against the spring bias while secondary jig index pins are meshed with corresponding sockets in the fabrication boat that are aligned with the package position on the boat. When the pins and sockets are meshed, the pressure foot is released to apply optimal assembly force at the package center normal of the package lid plane.

11 Claims, 8 Drawing Sheets

METHOD OF CENTERING A HIGH PRESSURE LID SEAL

BACKGROUND OF THE INVENTION

The present invention relates to integrated circuit (i.c.) fabrication methods and apparatus. In particular, the invention relates to methods and supporting apparatus to apply centered, perpendicular force to an integrated circuit package lid during the hermetic seal curing process interval.

Integrated circuits are frequently packaged for product assembly in sealed casements having only connector leads or points exposed for external conduit connection. Such packages are fabricated in laminated tiers with a dielectric base plate and a ceramic or plastic lid plate. Between the lamination tiers are two or more additional layers that route and electrically isolate electrical paths between specific circuit junctures on the integrated circuit chip and a corresponding connector lead or pin. The actual circuit chip is potted within a cavity surrounded by the laminations.

In the course of fabrication, as the laminations are added, vertically separated groups of connector leads are connected to the chip. Finally, the assembly is sealed by the addition of a cover or lid. Depending on the integrated circuit package type, the lid may be hermetically sealed by an epoxy adhesive or metallic solder, for example. Traditionally, the adhesive or solder is applied to either or both faces of the lid and substrate and cured or set while the lid is held down under a predetermined force applied by a spring clip. Unfortunately, excessive seal failures occur because of insufficient or inadequate distribution of seal force. These insufficiencies or inadequacies are perceived to arise from the lack of means to locate and direct the seal force along a central axis perpendicular to the lid plane.

It is, therefore, an object of the invention to provide a method for sealing an i.c. package lid that centers the sealing force normal to the lid plane.

It is also an object of the invention to provide a method which interfaces with an i.c. package assembly boat to uniformly locate the clip sealing force.

Another object of the present invention is to provide a method using a sealing load clip that may be reliably positioned at a predetermined location on an assembly boat and i.c. package lid.

SUMMARY OF THE INVENTION

These and other objects of the invention as will be apparent from the following descriptive detail, are served by a method for applying a compressive force against an i.c. package lid while confined within an assembly boat socket. Such force is applied along an axis that is substantially central of the lid and perpendicular thereto. The invention method includes the steps of retracting the pressure foot of a secondary loading jig against the resilient bias of a spring and positioning the jig across the assembly boat to mesh a plurality of index pins on the loading jig with corresponding index sockets on the assembly boat. In meshing position, the pressure foot is confined to spring force application along the central axis of the lid.

A package fabrication boat utilized by the method includes a plurality of package alignment sockets, each of which laterally confine and restrain movement of a respective package during the course of integrated circuit processing. Process control index holes in the top surface and side rails of the boat are aligned coordinately with the package sockets. Pins secured to the force application clip mesh with appropriate pairs of index holes to secure an aligned position of the force clip.

In one embodiment of the invention, a force applying pressure foot forms one end of a spring loaded rocker bar. The bar oscillates about a rocker axis that is parallel to the package lid surface but is biased in the pressure foot rotational direction for loading against the package lid.

Another embodiment of the invention includes a pressure foot secured to one end of an alignment shaft. The force clip includes structural guides to confine the alignment shaft and limit movement to axial reciprocation. A compression spring biases the pressure foot toward the package lid when the force clip is attached to an assembly boat.

DESCRIPTION OF THE PREFERRED EMBODIMENTS

Figure 1:
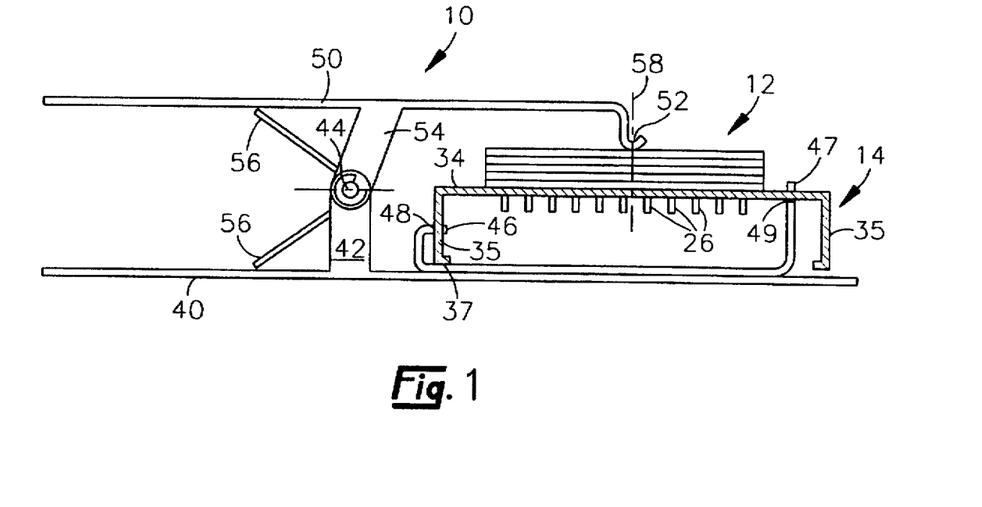
FIG. 1 is an end elevation relating to the invention first embodiment in operative combination with a package assembly boat.

The method of the present invention is practiced with the apparatus shown by the drawings wherein like reference characters designate like or similar elements throughout the several figures of the drawing. In a first embodiment of the invention illustrated by FIG. 1, a loading clip 10 is shown as operationally engaged with an integrated circuit (i.c.) package 12 and a corresponding i.c. package assembly jig 14 characterized in the art as a "boat".

Figure 2:
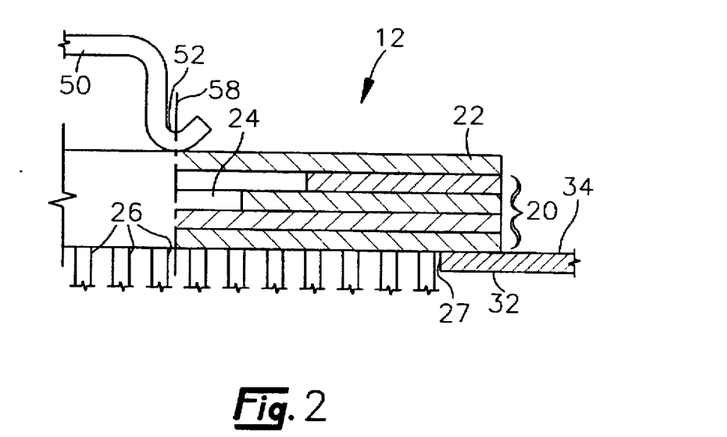
FIG. 2 is a partially sectioned detail relating to the first embodiment combination.
Figure 3:
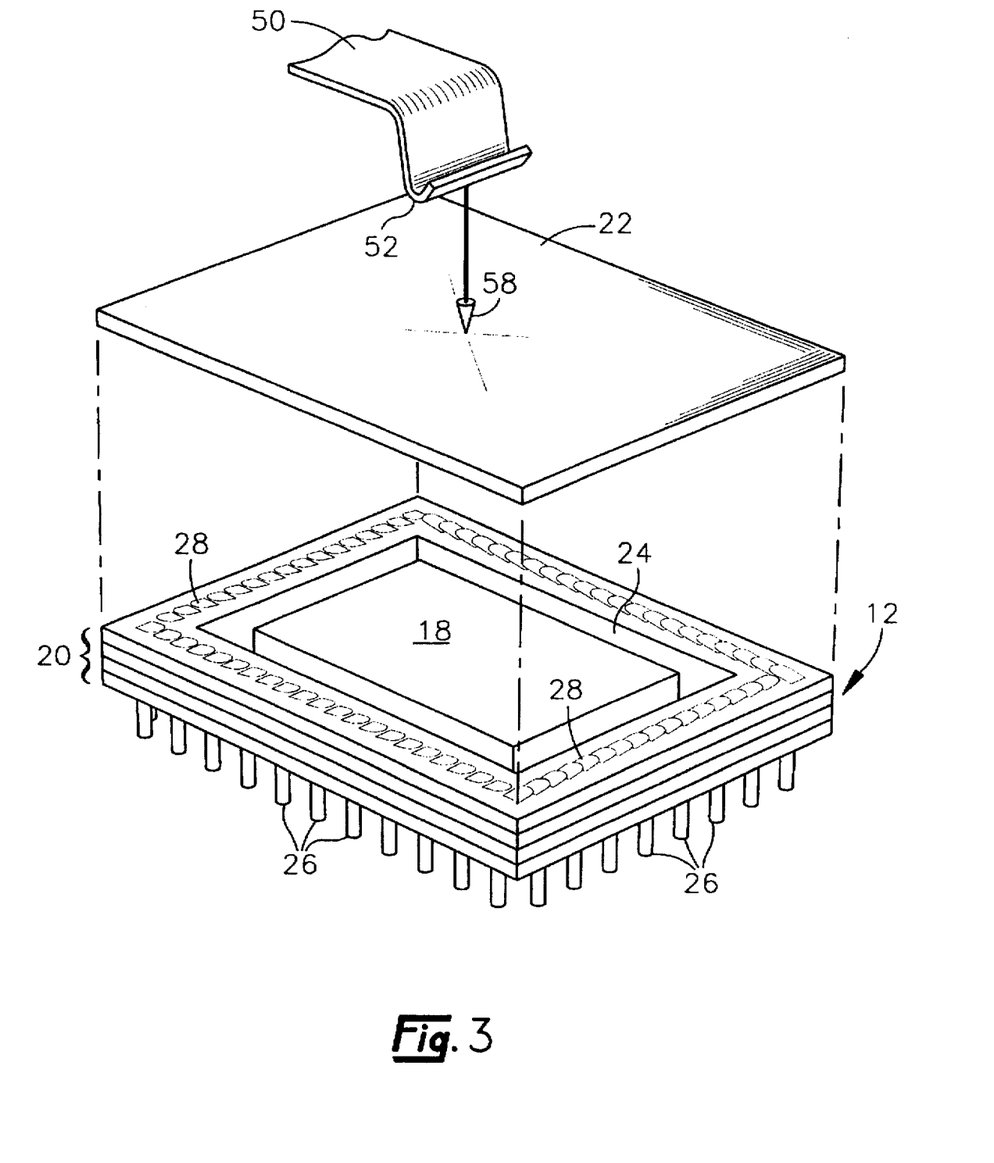
FIG. 3 is an exploded assembly view of an integrated circuit package.

Relative to the exploded assembly of FIG. 3 and the partial section shown by FIG. 2, an i.c. package 12 includes a package base 20 formed by a laminated plurality of layers that are capped by a lid 22. The i.c. chip 18 is potted within the stepped void 24 formed within the center of the laminated base 20. The laminated layers 20 provide conductor separation between the i.c. chip and connector pins 26 projecting from the package bottom.

Figure 4:
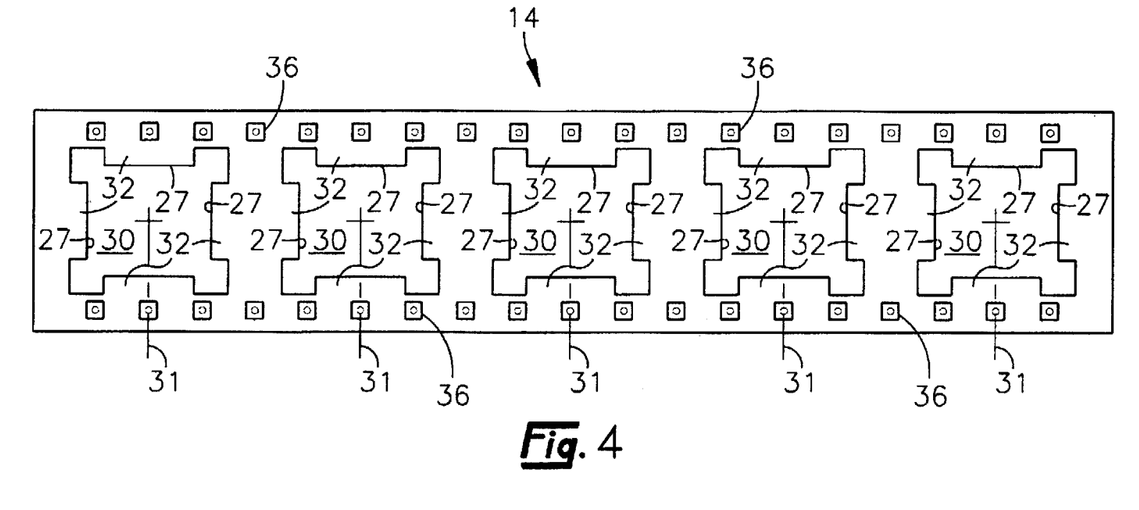
FIG. 4 is a plan view relating to an integrated circuit package assembly boat.
Figure 5:
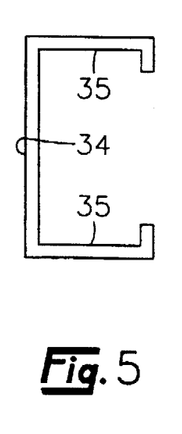
FIG. 5 is an end elevation relating to the package assembly boat.
Figure 6:
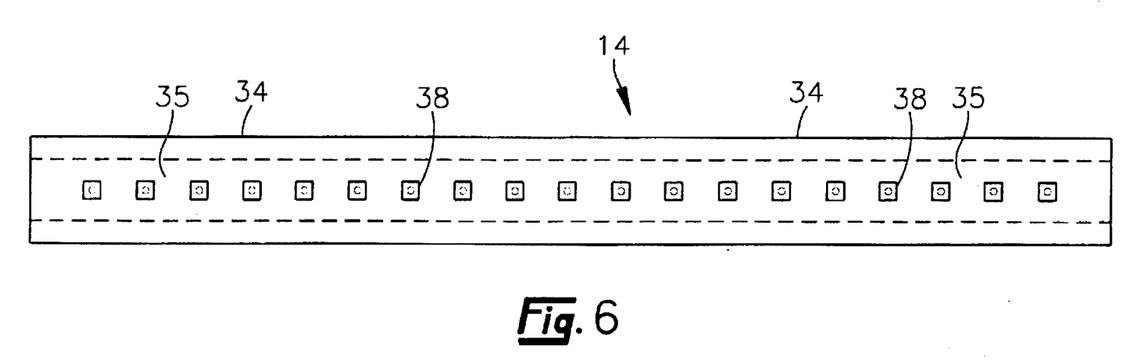
FIG. 6 is a side elevation relating to the package assembly boat.

FIGS. 4, 5, and 6 illustrate the characteristics of an assembly boat 14 to include a multiplicity of package sockets 30 which are apertures in the boat top plate 34. Four tabs 32 around the perimeter of each socket 30 are integral extensions of the top plate 34. The spacial distances between oppositely facing edges 27 are dimensioned to receive the pin 26 base of a package 12 therebetween for lateral confinement and vertical support. Also in the boat top plate 34 along the longitudinal sides of the top plate are respective rows of index sockets 36. Additional index sockets 38 are formed in the boat side rails 35. It will be noted that a pair of index sockets 36 and 38 are aligned with the transverse centerlines 31 respective to each socket 30. Between each centerline 31, four, equidistant, index socket intervals are provided for this example.

With respect to FIGS. 1–3 and 7–9, a second jig in the cooperative assembly is a loading jig or spring force clip 10 comprising a base plate 40 having a pair of axle pedestals 42 projecting therefrom to support an axle 44. Also projecting from the base plate 40 are a pair of index pins 46 and 47. Pin 46 is turned substantially parallel with the base plate 40 whereas pin 47 projects substantially normal to the base plate 40 plane.

Pin 46 is flanked by abutment shoulders 48 and pin 47 is flanked by abutment shoulders 49. As shown by the assembly elevation of FIG. 1, the dimensional locations of pins 46 and 47 and their corresponding abutment shoulders are coordinated to the index sockets 36 and 38 of the assembly boat 14.

Figure 7:
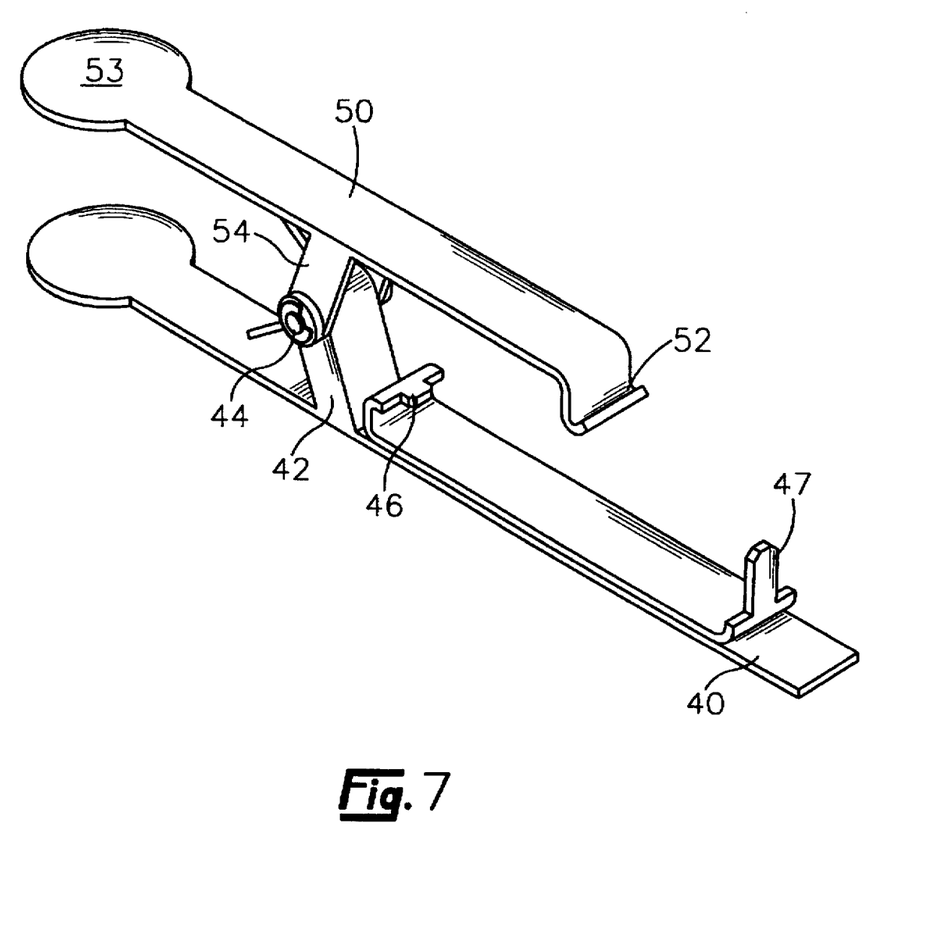
FIG. 7 is a pictorial view relating to a first embodiment of the invention.
Figure 8:
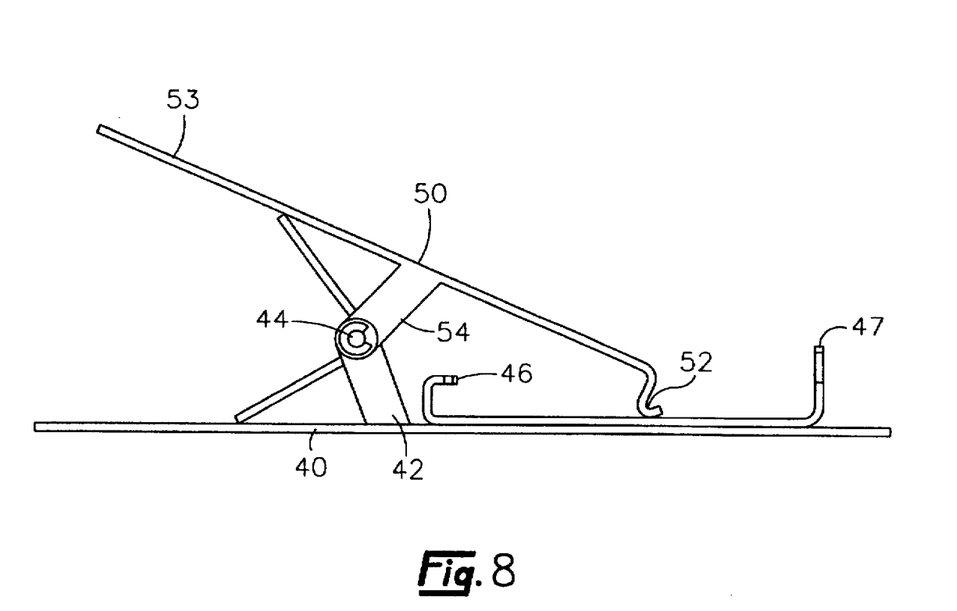
FIG. 8 is a side elevation relating to the invention first embodiment.
Figure 9:
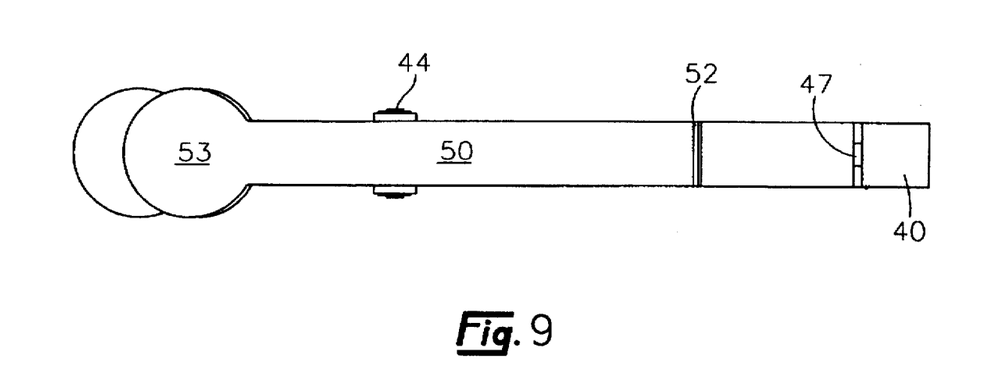
FIG. 9 is a plan view relating to the invention first embodiment.

Clamping bar 50 includes a pressure foot 52 at one end and a hand pad 53 at the other end on opposite sides of the axle 44. Legs 54 rotatively support the bar 50 over the axle 44. A helically coiled tensile spring wrapped about axle 44 includes reaction arms 56 to resiliently bias rotation of the clamping bar about the axle 44. Such rotational bias is opposed at the pressure foot 52 by the i.c. package 12. Preferably, the spring clip components are dimensionally coordinated to position the point of pressure foot 52 engagement against the i.c. package lid 22 in the plane of the axle 44 axis and along the axis 58 at the center of the chip void 24. Here, the i.c. package lid is resiliently clamped with a perpendicular bearing load of known value, preferably in the range of about 1.5 to 5 pounds, at substantially the optimum position to provide a uniformly distributed curing pressure between the lid 22 and the lower lamination 20.

In operating process sequence, the i.c. package assembly (FIG. 3) is completed by application of an adhesive or solder 28 to the interfacing surfaces respective to the package lid 22 and the uppermost surface of the lamination 20. This assembly is positioned in a package socket 30 with the connector pins 26 laterally caged between the internal edges 27 of tabs 32. In most cases, this socket position will locate the i.c. assembly 12 center point in the transverse plane 31 which bisects the socket 30 and corresponding edge rail sockets 38 and top plate sockets 36.

The loading jig 10 is combined with the boat by depressing the clamping bar 50 at the hand pad 53 to lift the pressure foot 52 away from the base plate 40. In this configuration, the pin 46 is meshed with the edge rail socket 38 along an angular line of penetration until the shoulder 48 abuts the face of rail 35.

With the shoulder 48 against the rail 35, the loading jig 10 is rotated about the shoulder/rail engagement line thereby bringing the index pin 47 into meshing penetration of the corresponding top plate socket 36 until the shoulder 49 seats against the bottom face of the top plate 34.

With the index pins 46 and 47 meshed with corresponding sockets 38 and 36, respectively, the base edge 37 of rail 35 engages the transversely flat surface of base plate 40 to further immobilize and locate the loading jig 10 relative to the boat 14.

In this condition, the clamping bar is gently released to engage the lid covered i.c. package 12 with a constant and calibrated compression force applied at or very near the lid 22 center along the load axis 58. Such assembly may be repeated for an i.c. package in each of the boat sockets 30 in a particular boat 14. A completely assembled boat jig 14 secured by the present invention is stable against abrupt movement encountered by a boat jig in a further process conveyance line.

A second spring clip embodiment of the invention 16 is illustrated by FIGS. 10–13 to include a semi-box frame 60 having two pairs of legs 62 and 64, respectively, to laterally stabilize the frame 60 against the top plate 34 of the boat 14.

At respective ends of the frame 60 are indexing arms 66 and 68. Index arm 68 has a structurally rigid relationship to the semi-box frame 60 and stabilizing legs 62 whereas the indexing arm 68 is rotatable about the axis of axle pin 69. Preferably, rotation of index arm 68 is spring biased to maintain an engagement force against a boat rail 35. Indexing arm 66 carries index socket pin 70 which meshes with an appropriate edge rail index socket 38. The pivoting indexing arm 68 carries indexing pin 78 for engaging sockets 38 in the opposite side rail.

Dimensionally, the bottom edges of the stabilizing legs 62 and 64 are coordinated with the index pins 70 and 72 to secure a boat 14 to the semibox frame 60 structure with the boat top plate 34 perpendicular to the reciprocation axis 74 of a pressure foot 76. Also, the separation distance between the indexing arms and their relative spacing from the axis 74 is aligned for coincidence of the axis 74 with the lid load axis 58.

Figure 10:
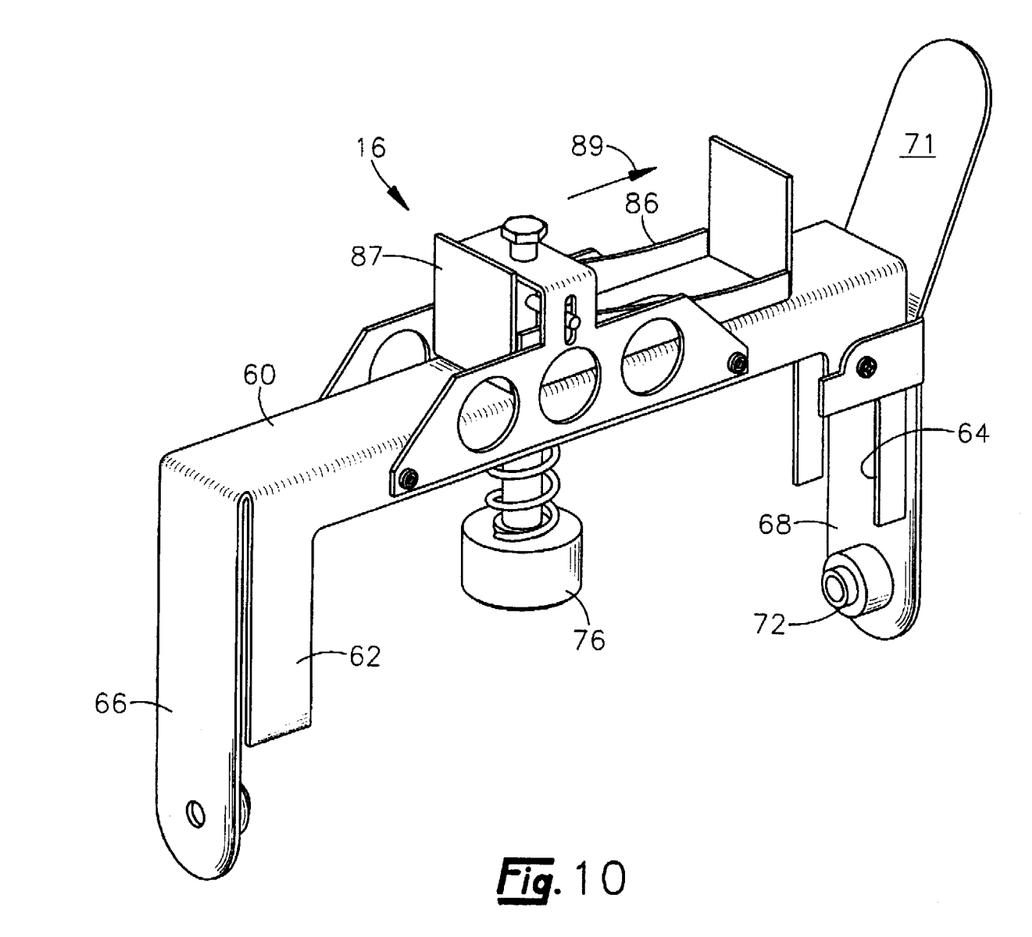
FIG. 10 is a pictorial view relating to a second embodiment of the invention.
Figure 11:
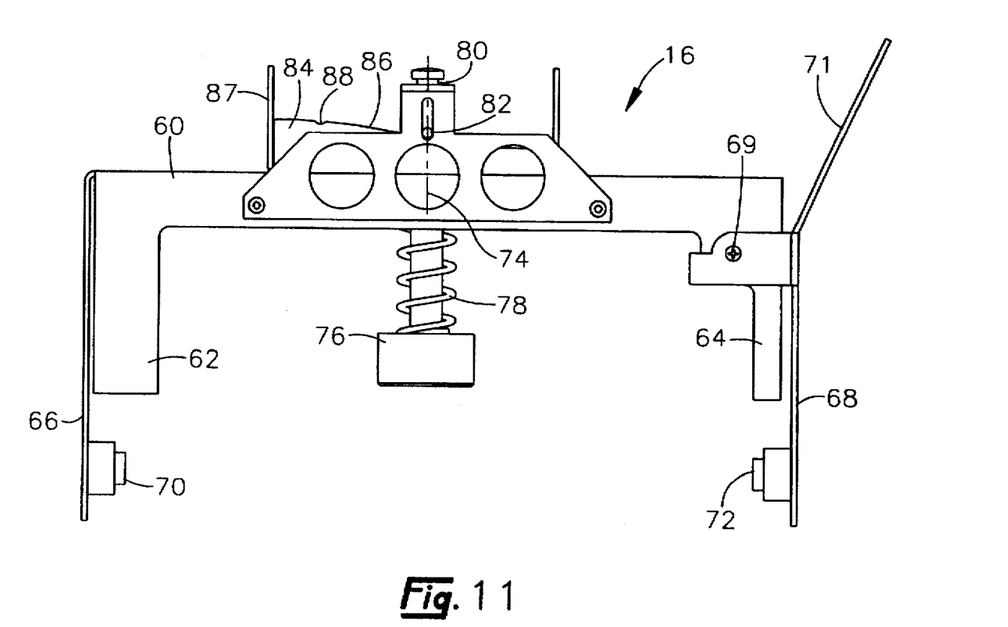
FIG. 11 is a side elevation relating to the invention second embodiment.
Figure 12:
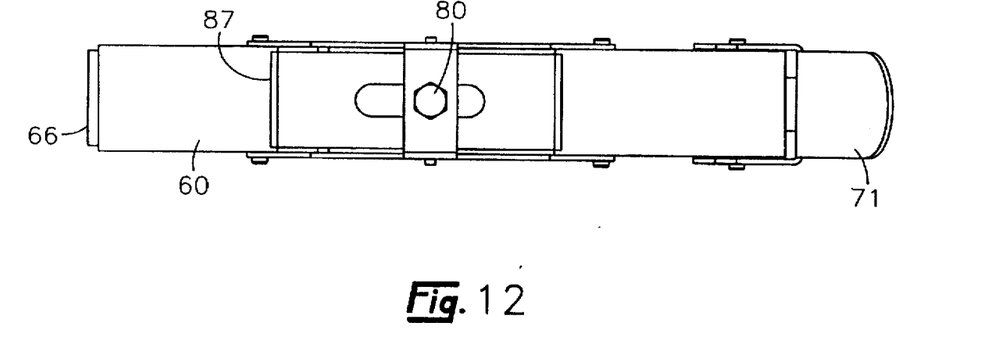
FIG. 12 is a top plan view relating to the invention second embodiment.
Figure 13:
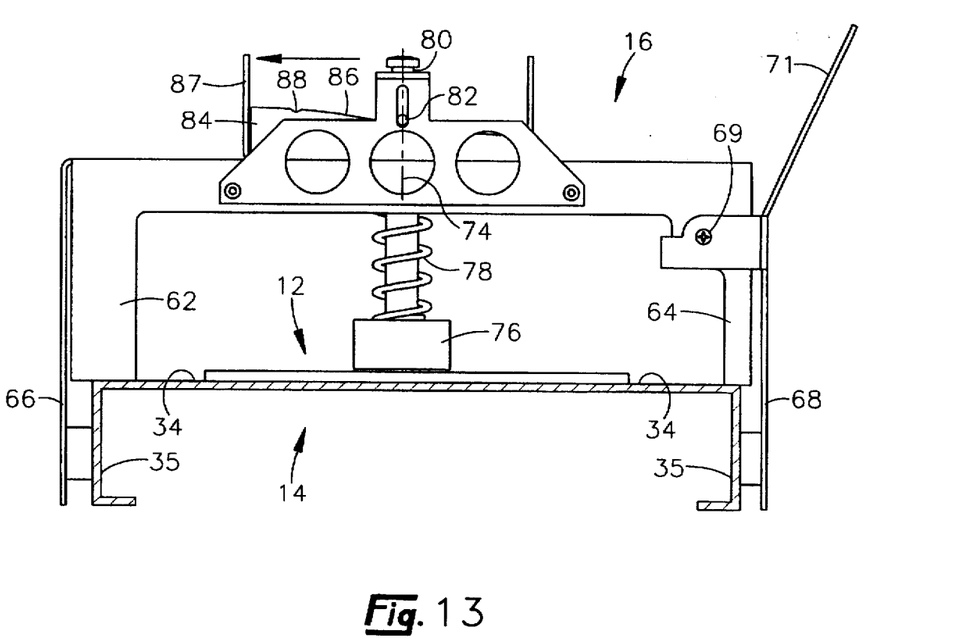
FIG. 13 is a side elevation relating to the invention second embodiment engaged with a package assembly boat.

Pressure foot 76 is secured to the distal end of a guide rod 80 and urged away from the semi box frame by a coiled compression spring 78 wound about the rod 80. A cross-pin or yoke bar 82 is secured to the guide rod 80 and rides on the ramp 84 edges 86. A detent pocket 88 is formed in the upper edge surfaces to stabilize the yoke bar 82 and guide rod 80 at the upper position at which the spring 78 is compressed and the pressure foot 76 is withdrawn from the i.c. package 12 surface. This relationship of the yoke bar 82 saddled into the pocket 88 is attained by sliding the ramp frame 87 to an extreme position in the direction of the arrowhead 89 (FIG. 10). When pushed to the extreme position in the opposite direction of arrowhead 90 (FIG. 13), the yoke bar 82 rides down on the ramp edges 86 and permits the compression spring 78 to load the pressure foot 76 against the i.c. package lid.

As with the first invention embodiment, the i.c. package and lid are positioned on the boat 14 socket 30 with adhesive or solder 28 applied between the lid 22 and lower lamination 20. When the pivotable index arm 68 is rotated about the axis 69 against a spring bias by manually squeezing between the thumb pad 71 and an upstanding tab of ramp frame 87, the pressure foot 76 and attached guide rod 80 are lifted against the bias of spring 78 and cocked in the detent 88. So configured, the loading jig 16 is aligned to insert the index socket pin 70 into the desired rail socket 38 located along the transverse center plane 31. This alignment will place the base of legs 62 and 64 on the surface of boat top plate 34. The pivotable index arm 68 is then released to mesh the index pin 72 with the axially opposite rail socket 38 thereby setting the loading jig 16 with the boat 14 and package 12. In this condition the ramp frame 87 is shifted to the left as viewed at FIG. 13 and the pressure foot 76 is released to engage the i.c. package 12.

Having fully disclosed the preferred embodiments of our invention, those of ordinary skill in the art will note obvious alternatives and equivalents for practicing the spirit of our invention. As our invention, therefore,

We claim:

1. A method for applying a resilient force bias along a loading axis substantially central of and perpendicular to a packaged integrated circuit lid while confined in a respective assembly boat socket, said method comprising the steps of positioning an integrated circuit package base in an assembly boat package socket, positioning a lid upon said integrated circuit package base with an adhesive between juxtaposed surfaces respective to said package base and said lid, retracting against a spring bias a reciprocally guided pressure foot along a reciprocation axis that is confined within a loading jig, mechanically securing said pressure foot at said retracted position, attaching said loading jig to said assembly boat with said reciprocation axis aligned substantially coaxially with said loading axis and, releasing said pressure foot to resiliently bear against said lid.

2. The method of claim 1 wherein said step of attaching comprises retracting two opposed, resiliently biased indexing pins to separate the pins by a distance greater than a predetermined distance, aligning the pins with a pair of indexing sockets formed in said assembly boat and spaced apart approximately by the predetermined distance, releasing the retraction of said resiliently biased pins and thereby inserting the pins into said sockets and centering said pressure foot with respect to said lid.

3. A method as described by claim 2 where said pressure foot is secured at said retracted position by engaging a detent pocket provided in a sliding ramp.

4. A method as described by claim 1 further comprising the step of sealing said lid to said integrated circuit package base.

5. A method for applying resilient force bias along a loading axis substantially central of and perpendicular to a packaged integrated circuit lid while confined in a respective assembly boat socket, said method comprising the steps of positioning an integrated circuit package base in an assembly boat package socket, positioning a lid upon said integrated circuit package base with an adhesive between juxtaposed surfaces respective to said package and said lid, retracting against a spring bias a reciprocally guided pressure foot along a reciprocation axis that is confined within a loading jig, attaching said loading jig to said assembly boat with said reciprocation axis aligned substantially coaxially with said loading axis and, releasing said pressure foot to resiliently bear against said lid.

6. The method of claim 5 wherein said step of attaching said loading jig to said assembly boat comprises the penetration of at least a pair of opposed pins into a corresponding pair of indexing apertures.

7. The method of claim 6 wherein said pair of pins are secured to said loading jig with at least one pin of said pair being resiliently biased to pivot about an axle pin axis that is substantially normal to said pressure foot reciprocation axis.

8. The method of claim 7 wherein said one pin of said pair is pivoted about said axle pin axis against said resilient bias to allow penetration of said indexing apertures formed in said assembly boat by another pin of said pair.

9. The method of claim 8 wherein said step of attaching said loading jig to said assembly boat comprises the penetration of said corresponding indexing apertures by release of said one pin to pivot about said axle pin axis from said resilient bias.

10. The method of claim 8 wherein said pressure foot is mechanically secured at a retracted position and said one pin is pivoted about said axle pin axis for attaching said loading jig to said assembly boat with penetration of said indexing apertures by said pins.

11. The method of claim 5 further comprising the step of sealing said lid to said integrated circuit package.

* * * * *